United States Patent [19]

Luque

[11] 4,169,738
[45] Oct. 2, 1979

[54] DOUBLE-SIDED SOLAR CELL WITH SELF-REFRIGERATING CONCENTRATOR

[76] Inventor: Antonio Luque, Leneros 29, 1° B, Madrid 20, Spain

[21] Appl. No.: 853,483

[22] Filed: Nov. 21, 1977

[30] Foreign Application Priority Data

Nov. 24, 1976 [ES] Spain .................................. 453.575
Feb. 4, 1977 [ES] Spain .................................. 455.632
May 5, 1977 [ES] Spain .................................. 458.514

[51] Int. Cl.² ............................................ H01L 31/06
[52] U.S. Cl. ........................... 136/89 PC; 136/89 CC; 136/89 SJ; 136/89 CA; 357/30
[58] Field of Search ............ 136/89 PC, 89 CC, 89 SJ

[56] References Cited

U.S. PATENT DOCUMENTS

| | | | |
|---|---|---|---|
| 3,278,811 | 10/1966 | Mori .................................... | 317/234 |
| 3,638,026 | 1/1972 | Scott et al. ......................... | 250/211 J |
| 3,682,708 | 8/1972 | Bennett ............................... | 136/89 |
| 3,948,682 | 4/1976 | Bordina et al. .................... | 136/89 |
| 4,003,638 | 1/1977 | Winston .............................. | 350/293 |
| 4,004,949 | 1/1977 | Lesk ..................................... | 148/1.5 |
| 4,045,246 | 8/1977 | Mlavsky et al. ................... | 136/89 PC |
| 4,052,228 | 10/1977 | Russell ............................... | 136/89 PC |
| 4,056,404 | 11/1977 | Garone et al. .................... | 136/89 PC |
| 4,070,206 | 1/1978 | Kressel et al. .................... | 136/89 TF |

*Primary Examiner*—Aaron Weisstuch
*Attorney, Agent, or Firm*—Pearne, Gordon, Sessions, McCoy & Granger

[57] ABSTRACT

A planar solar cell photovoltaically active on both sides is positioned in a solar concentrator capable of simultaneously illuminating both sides of the cell. The cell is immersed in a transparent liquid that enhances solar energy concentration and aids in removing undesirable heat from the cell. The solar cell, having two photovoltaically active sides, can be constituted by a n+pn+ structure or by a n+pp+ structure. Electrically conductive metal grids serving as cathode and anode connections are formed on both sides of the cell. The grid apertures advantageously allow the light to enter into the appropriate semiconductor regions. In the case of a n+pn+ structure, window means in the n+ layers are provided to permit electrical contact between the anode grids and the p region. Solar cells with complementary dopings, for example p+np+, are also possible.

5 Claims, 6 Drawing Figures

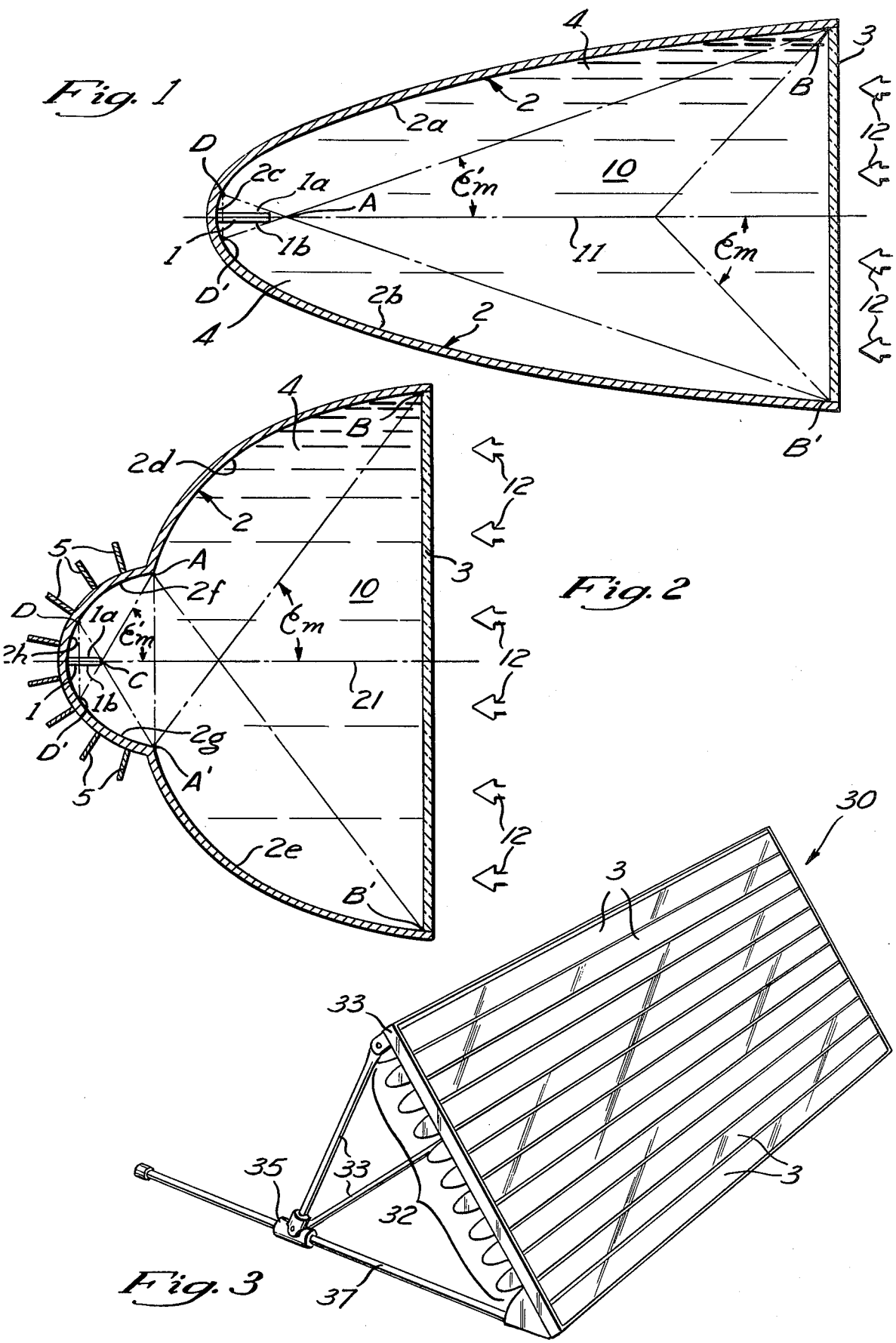

DOUBLE-SIDED SOLAR CELL WITH SELF-REFRIGERATING CONCENTRATOR

BACKGROUND OF THE INVENTION

The present invention is in the field of direct solar-to-electrical energy conversion using refrigerated photovoltaic cells subjected to concentrated solar energy or sunlight.

The optimal design of conventional cylindrical solar concentrators which focus all the solar energy incident on its cylindrical collector surface of arbitrary cross-section requires that the angle formed by the sun ray projection on the plane normal to the cylinder generatrices and the axis of the concentrator be smaller than what is known as the acceptance angle $\epsilon m$ of the concentrator.

For such optimal concentrators, the relationship $$G = 1/\sin \epsilon m$$

is verified, where the gain G is the ratio between the concentrator entrance aperture length and the collector perimeter. The relationship between G and $\epsilon m$ constitutes a thermodynamic limit in the trade off between both parameters if only a homogeneous means is transversed by the sun's rays.

Optical concentrators of, for example, the cylindrical type, have been used in connection with planar solar cells by placing the negative contact area (lower surface) of the cells adjacent the bottom of the concentrator wherein only one side (upper surface) of each solar cell is exposed to concentrated solar radiation, resulting in only one side of the cell being photovoltaically active. Conventionally, the unexposed solar cell lower surface is utilized to transfer undesirable heat built-up in the cell to thermal radiators or water forced refrigeration means.

Hollow pipes of single crystal silicon made by a well-known technique, with a solar cell integrally formed on the outer surface of the pipe so as to wrap-around it, have also been placed in cylindrical solar concentrators. In this case, forced circulation of water through the interior of the pipe removes the undesirable heat from the underside of the wrapped-around cell.

A large acceptance angle $\epsilon m$ is desired in cylindrical concentrators since it allows the concentrator to remain static, thus precluding the need for sun tracking type moving parts. Only periodic seasonal changes of orientation are necessary.

It would be desirable to provide planar solar cells having both sides photovoltaically active in a cylindrical optical concentrator since such a structure would allow maximum utilization of the high cost semiconductor mass for a given acceptance angle $\epsilon m$.

A major problem encountered in attempting to use planar solar cells having two photovoltaically active sides lies in the fact that heat generated in the cell when it is used in an solar energy concentrator must be removed.

The planar solar cells of the prior art have only one photovoltaically active side. A multijunction cell formed by a technique developed long ago in the manufacturing of high voltage diodes (used in T.V. sets) is related to a two-sided solar cell. The technique includes the steps of piling up a set of silicon wafers in which a pn junction has been previously formed; placing sheets of aluminum foil between next adjacent silicon wafers; heating the stack to alloy the aluminum to the silicon wafers; and sawing the stack along lines parallel to its longitudinal axis to form slices which present pn diodes connected in series. The characteristic of this multijunction type of cell is to provide low current and high voltage. Due to the low current characteristic of this cell, it is suitable for applications where voltage drops due to high currents are to be avoided.

While the multijunction cell is inherently a double-sided cell, it has never been used in the environment of double-sided concentrated solar illumination wherein cell cooling must be provided. Further, lateral illumination of the multijunction cell would be very inefficient so as to require large amounts of concentrated solar illumination that cannot be provided by known optical concentrators. Finally, the lateral sawing process step in forming multijunction devices wastes high cost silicon.

SUMMARY OF THE INVENTION

The present invention includes a planar, two-sided solar cell means photovoltaically active on both sides, and cylindrical solar concentrator means able to illuminate the two-sided cell means simultaneously on both side faces. A transparent fluid that, at least in part, fills the cylindrical concentrator, aids in removing excess heat from the cell which is at least partially immersed in the fluid. The transparent fluid also improves the concentrator's optical performance.

Use of a two-sided solar cell simultaneously illuminated on both photovoltaically active side faces doubles the effective gain of the concentrator, this gain being defined as the ratio between the concentrator aperture width and the cell assembly width (photovoltaically active surface). The use of a fluid or liquid, for cooling as noted above, having a refractive index n, increases this effective gain n times.

For example, an acceptance angle $\epsilon m$ of the collector equal to 11.54° provides an average energy of 5.96 KWH/m$^2$ each day with variations of ±2.38 KWH/m$^2$ per day in the climate of Madrid, Sprain, with only four seasonal changes of the concentrator elevation. For this acceptance angle a theoretical efficient gain of the concentrator of the present invention, filled with water, is approximately 13.30 while the theoretical efficient gain of a concentrator with a conventional one-sided solar cell without liquid filling the concentrator is approximately 5.0. Practical effective gains of 10.14 have been attained for the concentrator and two-sided solar cell assembly of the present invention.

The liquid in which the cell assembly is immersed removes the generated cell heat by natural convection and transfers it to the concentrator walls where air cooling fins may be provided. Also, forced circulation of the liquid can be provided where increased cooling is necessary due to high ambient temperatures.

In the case of natural convection, the temperature of the cell is approximately 10° C. over the ambient temperature for winds of 5 KM/hr.

In accordance with the present invention, solar cells photovoltaically active on both side faces can be formed by doping silicon wafers (for example p-type) with an appropriate donor impurity (for example n+-type) on both sides except at selected areas or windows of the surfaces (undoped regions) where electric contacts have to be taken to the cell supporting base (p region). Two metal grids electrically insulated from each other are formed on the side face surfaces of the cell.

Two opposed metal grids are connected to the doped layers (n+ regions) of each side surface and form one electrode of the solar cell (the "cathode" where the surfaces are n+ doped). The other two opposed metal grids are connected to the undoped selected window areas (p region) on the side surfaces to form the other electrode (the "anode" where a p region base is used).

Such a photovoltaic cell presents high values of open circuit voltage and short circuit current while maintaining an acceptable value of the internal resistance. Practical efficiencies of 12% or ten suns illumination can be attained.

An alternative way of manufacturing a double sided cell in accordance with the present invention consists of doping with acceptable donor atoms (n+-type for example) one of the faces of, for example, a p-type semiconductor wafer. The other face is doped with a high concentration of acceptor atoms (p+-type for example). In this way a n+p junction is formed adjacent one side face and a high concentration/low concentration (pp+) or simply "high-low" junction is formed adjacent the other face. A metal grid is formed on each side. The metal grid on the n+ face constitutes the cathode of the cell, while the metal grid on the p+ face constitutes the anode of the cell. This double-sided cell can be manufactured at a lower cost than that previously discussed but is more sensitive to the quality of the starting semiconductor wafer.

BRIEF DESCRIPTION OF THE DRAWINGS

FIG. 1 is a cross-sectional view of a solar concentrator and two-sided solar cell assembly in accordance with the present invention.

FIG. 2 is a cross-sectional view of another type of solar concentrator and two-sided solar cell assembly in accordance with the present invention.

FIG. 3 is a perspective view of a typical solar collector panel utilizing the type of assembly illustrated by FIG. 1.

DESCRIPTION OF THE PREFERRED EMBODIMENTS

Figure 4:
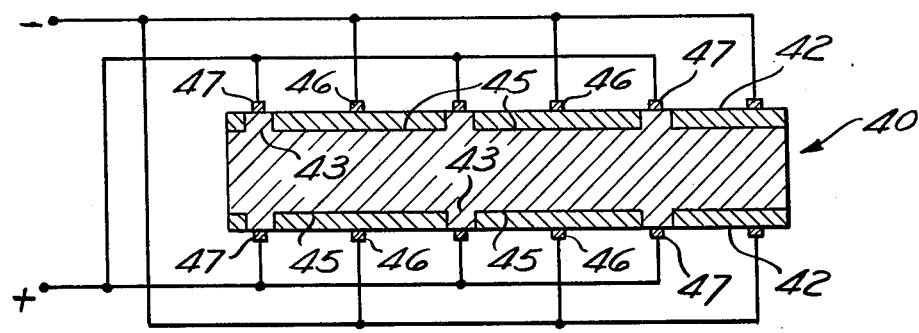
FIG. 4 is a cross-sectional view of a two-sided solar cell in accordance with the present invention.

Elongated trough-shaped cylindrical concentrators in accordance with the present invention, able to simultaneously illuminate a planar solar cell on both side-faces are presented in cross-section by FIGS. 1 and 2. Both FIGS. 1 and 2 represent an assembly of solar cells 1 photovoltaically active on both its faces 1a-1b. Arcuate reflecting surfaces 2 and sheets of transparent solid material 3 define chambers 10 containing the solar cells 1. Liquid 4, preferably a dielectric to preclude short circuiting of exposed solar cell conductors, fills the inside of the concentrator and is interposed between the solar cells 1 and the concentrator. The liquid 4 helps to transfer any concentrated heat from the solar cell to the walls of the concentrator 2 where heat is removed by ambient air convection. Cooling fins 5 (FIG. 2) can be provided to aid such air cooling. While liquid is preferable for cooling, other fluids means such as a cooling gas stream could be utilized.

In the FIG. 1, an arcuate inner reflective surface 2a extending between points B and D defines a parabola with focus at point A and axis line B'D, another arcuate inner reflective surface 2b extending between points B' and D' defines a parabola with focus at A and axis line BD', and line DD' defines a circumference of a spheroidal section surface 2c with focus at A. With these profiles all the rays 12 which are incident to the reflecting surface 2 at an angle with the symmetry axis 11 of the concentrator between $\pm \epsilon'm$ are concentrated on the cell assembly 1 which is oriented at the bottom of the concentrator wherein the plane of the cell lies along the cross-sectional profile axis of the concentrator at the general focus point of the collector. A proper relationship between $\epsilon'm$ and $\epsilon m$ takes into account the refraction effect of the liquid, $$\epsilon m + \text{arc sin } (n \sin \epsilon'm)$$

Turning to FIG. 2, an arcuate inner reflective surface 2d extending between points A and B defines a parabola with focus at A' having an axis parallel to line AB', another arcuate inner reflective surface 2e extending between points A' and B' defines a parabola with focus at A having an axis parallel to line A'B, another arcuate inner reflective surface 2f extending between points A and D defines a parabola with focus at C and axis line AD', another arcuate inner reflective surface 2g extending between points A' and D' defines a parabola with focus at C and axis line A'D, and line DD' defines a circumference of a spheroidal section surface 2h with focus at C. The angle $\epsilon'm$ is calculated according to $$\epsilon m' = \text{arc sin } (1/n)$$

where n is the refraction index of the transparent liquid used.

All sun rays 12 which enter at an angle with a symmetry axis 21 of the solar cell between $\pm \epsilon'm$ are concentrated in the solar cells.

FIG. 3 shows a possible solar panel 30 made up with concentrators of the type illustrated by FIG. 1. The panel consists of a series of parallel oriented concentrators 32 placed in a frame 33 which can be inclined at a suitable angle by moving a step ring 35 along a rail 37 which is placed on the ground.

If forced cooling is provided, all concentrators are joined by a tube (not shown) which supplies the cooling liquid 4.

When using the optical profiles described above for a cooling liquid of index of refraction n, the concentrator gain is given by $$G = \frac{\text{concentrator aperture width}}{\text{collector perimeter}} = \frac{Ac}{2W} = n/\sin \epsilon \, m$$

where Ac and W are the concentrator aperture and photovoltaic cell width, respectively. The collector perimeter in this case is 2W, since both sides of the cell are active.

As the purpose of light concentration in connection with solar cells is to reduce the area of the solar cells, it seems more convenient to define an effective gain as $$G \text{ eff.} = Ac/W = 2n/\sin \epsilon m$$

in the case of double-sided solar cells. This is to be compared to the case of conventional cells without cooling liquid.

$$G\ \text{eff.} = Ac/W = G = 1/\sin \epsilon_m$$

Thus, for a fixed acceptance angle there is provided a significantly increased gain for the double-sided solar cell.

When the cells are placed inside the liquid and the system is oriented properly, concentrated sunlight falls on the cells and heats them. The cell efficiency decreases significantly with rising temperature. Such inefficiency is minimized by the present invention wherein the liquid moves the heat from the cell and transfers it to the walls of the concentrator as heretofore explained.

If the liquid is water and the concentrator has an effective gain of 10 the power density is at most 1 watt/cm². The difference in temperature between the cell assembly and the water is approximately 1.6° C., the water is nearly isothermal and has a temperature of about 8° C. over the ambient temperature with winds of 5 KM/hr.

When the cross-section profile of FIG. 2 is used to make the concentrator, the cooling fins 5 are usually necessary since the surface of heat interchange with the exterior is smaller with the FIG. 2 profile. If necessary, cooling fins can also be added to the concentrator of FIG. 1.

FIG. 4 illustrates a double or two-sided solar cell in accordance with the invention wherein both faces are photovoltiacally active. In this diagram, a wafer 40 of semiconductor material that has been previously doped with acceptor atoms of, for example, p-type conductivity, has both side surfaces 42 doped with donor atoms (n+-type) so that p-n+ junctions 45 are formed on both sides. Selected areas or windows 43 on the side surface 42 are masked to prevent doping by the n-type atoms. Metal grids 46, 47 are deposited in a well known matter on both sides of the doped wafer and are electrically connected as shown. These grids permit photons to enter the photovoltaic areas of the cells. It can be seen that the metal grids 46 of the two n+-type layers are connected together to constitute a solar cell cathode. The two metal grids 47 on the exposed p region window areas 43 are connected together and constitute the cell anode.

Figure 5:
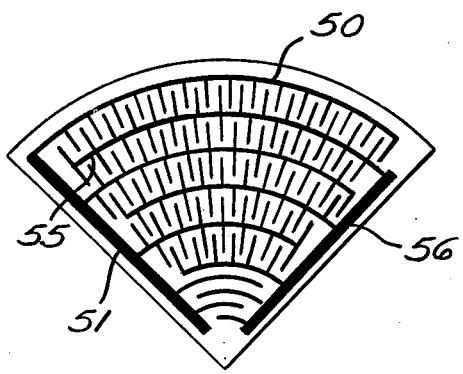
FIG. 5 is a plan view of a two-sided solar cell in accordance with the present invention.

FIG. 5 shows a plan view of a type of solar cell illustrated in FIG. 4. In this case, the cell has the shape of a quarter of a circle since the actual shape of the silicon slices from which four solar cell wafers are made is circular. When ribbons of silicon are commercially available, rectangular shapes will be used.

Interleaved anode grids 50 and cathode grids 55 are illustrated as being connected to buss bars 52 and 56 respectively. The anode grid is connected to the undoped surface areas 43 (see FIG. 4).

To obtain an alignment between the top and the bottom of the disclosed solar cell, a non-essential but convenient feature, a special mask with proper marks, is used in which the wafer can be centered, oriented and marked to help in the precision cutting of the circular silicon slice into quarters.

The theoretical behavior of the double-sided cell is different from that of conventional cells. Short wavelength photons entering through one of the faces, which we will refer to as the front face, are absorbed and the resultant current carriers are collected at the front junction as is the case in conventional cells. However, the long wavelength photons are also absorbed near the rear face and these produce carriers that are collected by the rear face junction. Those carriers would have been lost on the production of heat in the back non-photovoltaically conductive wall of conventional one-sided cells. Therefore, a higher generated current is produced in the double-sided cell than in a conventional solar cell.

Figure 6:
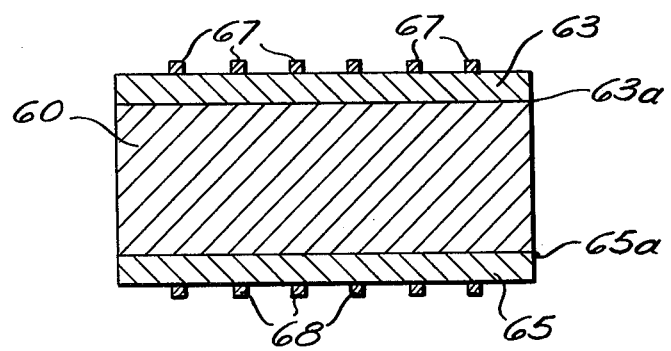
FIG. 6 is a cross-sectional view of another type of two-sided solar cell in accordance with the present invention.

FIG. 6 shows a cross-section of an alternative double-side solar cell structure in accordance with the present invention. A silicon semiconductor wafer 60 that has previously been doped with low concentration acceptor atom impurities (p-type) has deposited on one side 63 donor impurities (n+-type). On the other side 65 acceptor impurities (p+-type) of higher concentration than the base wafer 60 are applied. The interface between the p-type wafer and the n+ doping impurities forms a n+p junction 63a, while the interface between the p-type wafer and the higher concentration n+-type impurities forms a high-low junction 65a. A first metal grid 67 constitutes the cathode contact, while a second metal grid 68 constitutes the anode contact.

The cell is manufactured by means well known in semiconductor technology. When the cell is illuminated on the face, the cell acts very much like a conventional cell. When it is illuminated on the p+-type face, generated electrons are reflected by the field present in the high-low junction which does not prevent the passing of current towards the associated grid contact. Therefore the electrons are forced to travel towards the n+p junction where they have a high probability of being collected.

Depending on the lifetime of electrons in the base layer 60 and on the cell thickness, the efficiency of the cell illuminated on the p+ side can vary. For 150 um thick cells, standard lifetime efficiencies of only 20% below that of conventional cells can be obtained.

Although preferred embodiments of this invention are illustrated, it is to be understood that various modifications and rearrangements of parts may be resorted to without departing from the scope of the invention claimed herein.

What is claimed is:

1. An apparatus for directly converting solar energy to electrical energy comprising:
   a planar, single wafer of semiconductor material of a first conductivity type, said wafer having two doped sides to form two p-n semiconductor junction layers immediately adjacent and parallel to said doped sides, both of said doped sides being photovoltaically active;
   a solar concentrator for simultaneous high concentration illumination of both of said sides with concentrated sunlight, said wafer being fixed relative to said concentrator and oriented to simultaneously receive concentrated sunlight on both of said sides; and
   conductive grid means fixed to and extending over both of said sides and electrically connected to said wafer to serve as anode and cathode means, said grid means permitting substantial illumination of said sides, said grid means including at least one grid electrically connected to said wafer of first conductivity type via a plurality of window areas in at least one of said doped sides and at least another grid electrically connected to at least one of said doped sides, said p-n junction layer adjacent said windowed area side being discontinuous due to said interposed window areas.

2. An apparatus according to claim 1 wherein both of said sides include a plurality of said window areas for electrically connecting said grid means to said wafer, both of said p-n junction layers being discontinuous due to said interposed window areas.

3. An apparatus according to claim 1 wherein said first conductivity type is p-type and said sides are doped to provide $n^+$-type conductivity.

4. An apparatus according to claim 1 including a liquid interposed between said wafer and said concentrator, said liquid serving to transfer heat between said wafer and said concentrator.

5. A solar panel comprising a plurality of apparatus as claimed in claim 1.

UNITED STATES PATENT AND TRADEMARK OFFICE
CERTIFICATE OF CORRECTION

PATENT NO. : 4,169,738
DATED : October 2, 1979
INVENTOR(S) : Antonio Luque

It is certified that error appears in the above-identified patent and that said Letters Patent are hereby corrected as shown below:

Column 2, line 41, delete "Sprain", and insert --Spain--.
Column 5, line 54, delete "52", and insert --51--.
Column 6, line 19, delete "n+-type", and insert --p+-type--.
Column 6, line 25, after "face", insert --n+-type--.

Signed and Sealed this

Eleventh Day of December 1979

[SEAL]

Attest:

SIDNEY A. DIAMOND

Attesting Officer

Commissioner of Patents and Trademarks